United States Patent
Wang et al.

(10) Patent No.: US 7,535,128 B2
(45) Date of Patent: May 19, 2009

(54) TEMPERATURE DETECTOR

(75) Inventors: Dong Wang, Tokyo (JP); Akihisa Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 318 days.

(21) Appl. No.: 11/624,379

(22) Filed: Jan. 18, 2007

(65) Prior Publication Data

US 2008/0071493 A1    Mar. 20, 2008

(30) Foreign Application Priority Data

Sep. 15, 2006    (JP) .............................. 2006-250765

(51) Int. Cl.
*H01H 31/10*    (2006.01)
(52) U.S. Cl. ...................................... 307/115
(58) Field of Classification Search .................. 307/115
See application file for complete search history.

(56) References Cited

U.S. PATENT DOCUMENTS 6,736,540 B1 *  5/2004  Sheehan et al. ............. 374/183

FOREIGN PATENT DOCUMENTS

| DE | 100 11 179 B4 | 9/2001 |
|---|---|---|
| EP | 0 869 342 A1 | 10/1998 |
| JP | 2000-307403 | 11/2000 |

* cited by examiner

*Primary Examiner*—Robert L. Deberadinis
(74) *Attorney, Agent, or Firm*—Oblon, Spivak, McClelland, Maier & Neustadt, P.C.

(57) ABSTRACT

A temperature detector for outputting a temperature signal comprises: a temperature sensing diode formed on the same chip as a semiconductor switching device and having a specific temperature vs. voltage characteristic, wherein the temperature detector outputs the anode potential of the temperature sensing diode as the temperature signal; a constant current circuit for supplying a current to the anode of the temperature sensing diode; and anode potential holding means for holding the anode potential of the temperature sensing diode as the temperature signal at the start of switching operation of the semiconductor switching device.

7 Claims, 4 Drawing Sheets

TEMPERATURE DETECTOR

FIELD OF THE INVENTION

The present invention relates to a temperature detector for detecting the temperature of a chip on which a semiconductor switching device or devices are formed, and more particularly to a temperature detector that can avoid outputting erroneous temperature signals during the switching operation of the semiconductor switching device.

BACKGROUND ART

Semiconductor switching devices such as IGBTs (Insulated Gate Bipolar Transistors) will be thermally damaged if they are heated to excessive temperature due to high current operation. To prevent this, a temperature detector is used to detect the temperature of the chip.

FIG. 10 is a diagram showing the configuration of a conventional temperature detector (see, e.g., Japanese Laid-Open Patent Publication No. 2000-307403). Referring to the figure, a temperature sensing diode 13 is formed on the same chip 12 as a semiconductor switching device 11. A constant current circuit 14 supplies a constant current to the anode of the temperature sensing diode 13, and the anode potential of the temperature sensing diode 13 is used as a temperature signal indicating the temperature state of the semiconductor switching device 11. In this case, the circuit (not shown) that receives the temperature signal is designed to have a high input impedance, as is well known in the art. The forward voltage (Vf) of the temperature sensing diode 13 has a negative temperature coefficient (when the forward current is maintained constant), as shown in FIG. 11.

It should be noted that during the switching operation of the semiconductor switching device 11, negative noise is superimposed on the anode potential of the temperature sensing diode 13 due to wire inductance, loops, etc., resulting in a reduction in the anode potential. To prevent this, a CR filter 15 is inserted between the anode of the temperature sensing diode 13 and the output terminal to shape the temperature signal.

However, as the switching frequency increases, the potential of the temperature signal from the temperature sensing diode 13 gradually decreases, as shown in FIG. 12. Therefore, a conventional temperature detector may output an erroneous output signal even if the temperature signal from the temperature sensing diode 13 is shaped by the above filter, since the portions of the temperature signal affected by the negative noise may have a lower potential level than a predetermined threshold level.

SUMMARY OF THE INVENTION

The present invention has been devised to solve the above problem. It is, therefore, an object of the present invention to provide a temperature detector that can avoid outputting erroneous temperature signals during the switching operation of the semiconductor switching device.

According to one aspect of the present invention, a temperature detector for outputting a temperature signal comprises: a temperature sensing diode formed on the same chip as a semiconductor switching device and having a specific temperature vs. voltage characteristic, wherein the temperature detector outputs the anode potential of the temperature sensing diode as the temperature signal; a constant current circuit for supplying a current to the anode of the temperature sensing diode; and anode potential holding means for holding the anode potential of the temperature sensing diode as the temperature signal at the start of switching operation of the semiconductor switching device.

Thus, the present invention provides a temperature detector that can avoid outputting erroneous temperature signals during the switching operation of the semiconductor switching device.

Other and further objects, features and advantages of the invention will appear more fully from the following description.

DETAILED DESCRIPTION OF THE PREFERRED EMBODIMENTS

First Embodiment

Figure 1:
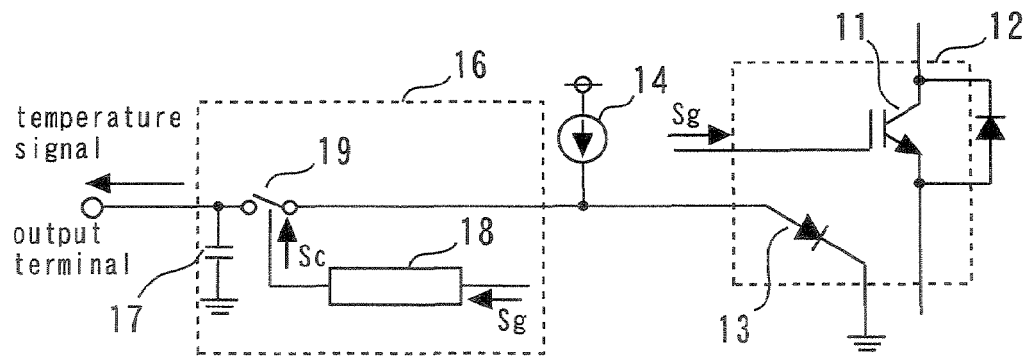
FIG. 1 is a diagram showing the configuration of a temperature detector according to a first embodiment of the present invention.
Figure 2:
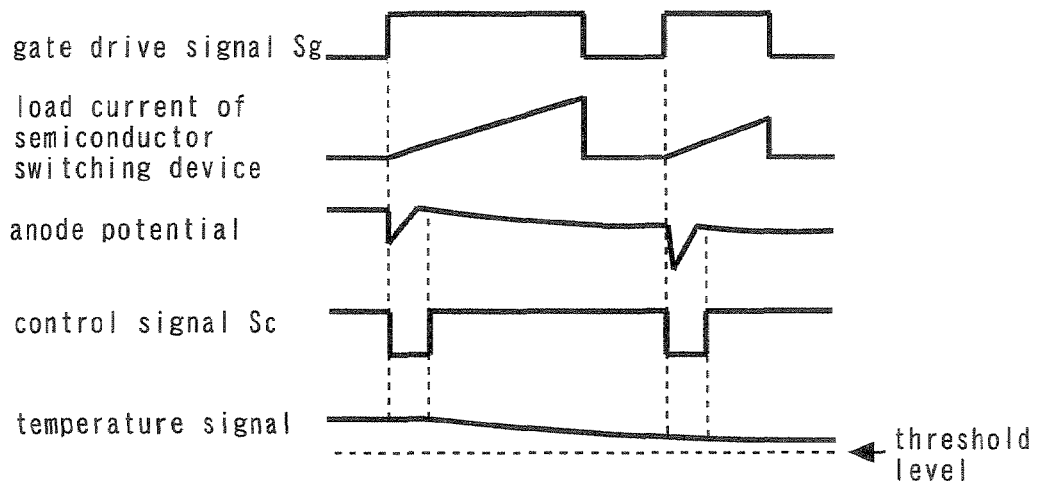
FIG. 2 is a timing chart showing the operation of the temperature detector shown in FIG. 1.

FIG. 1 is a diagram showing the configuration of a temperature detector according to a first embodiment of the present invention, and FIG. 2 is a timing chart showing the operation of the temperature detector.

As shown in FIG. 1, a temperature sensing diode 13 is formed on the same chip 12 as a semiconductor switching device 11 (an IGBT, etc.). The forward voltage of the temperature sensing diode 13 has a negative temperature coefficient when the forward current is maintained at a constant level. The cathode of the temperature sensing diode 13 is grounded. A constant current circuit 14 supplies a constant current of approximately 2 mA to the anode of the temperature sensing diode 13, and the anode potential of the temperature sensing diode 13 is output as a temperature signal. It should be noted that the voltage drop between both terminals of an individual temperature sensing diode is approximately 0.6 V (at 25° C.), and therefore a plurality of series-connected temperature sensing diodes are usually formed on the chip 12 to provide a combined voltage of approximately 2 V (and used as the temperature sensing diode 13).

Further, an anode potential holding means 16 is inserted between the anode of the temperature sensing diode 13 and the output terminal. The anode potential holding means 16 holds the anode potential of the temperature sensing diode 13 as a temperature signal at the start of (each turn-on operation in) the switching operation of the semiconductor switching device 11.

Specifically, the anode potential holding means 16 includes a capacitor 17, a one-shot pulse generating circuit 18, and a first switching means 19. One end of the capacitor 17 is connected between the anode of the temperature sensing diode 13 and the output terminal, while the other end is grounded. The one-shot pulse generating circuit 18 generates a control signal Sc in response to the gate drive signal (input signal) Sg to the semiconductor switching device 11. The control signal Sc is set at a low level for a predetermined period of time each time the gate drive signal Sg rises. Except for these periods, the control signal Sc is set at a high level. The first switching means 19 disconnects the anode of the temperature sensing diode 13 from the one end of the capacitor 17 while the control signal Sc from the one-shot pulse generating circuit 18 is at a low level, that is, for a predetermined period of time from the start of (each turn-on operation in) the switching operation of the semiconductor switching device 11. It should be noted that the switching means may be implemented by a MOS transistor, etc., and the one-shot pulse generating circuit may be made up of a timer or a filter.

Thus, the anode potential holding means 16 prevents the anode potential of the temperature sensing diode from being output when its level is lowered due to negative noise during the switching operation of the semiconductor switching device, which allows the temperature detector to avoid outputting erroneous signals.

Second Embodiment

Figure 3:
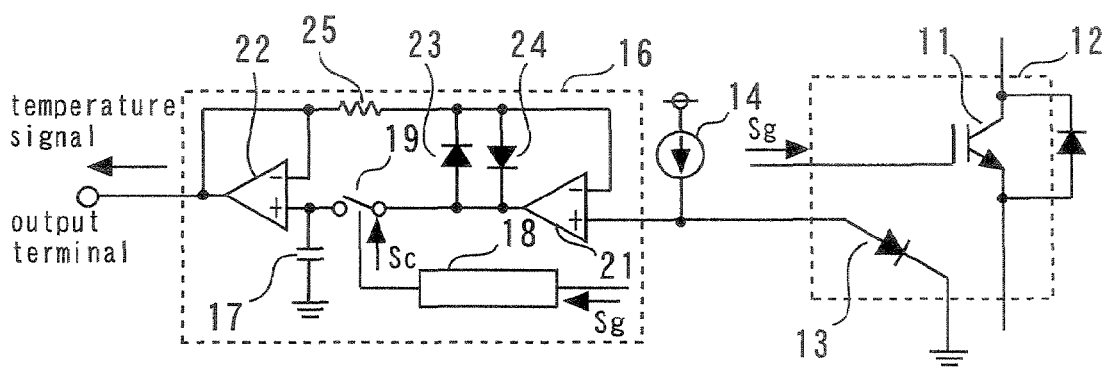
FIG. 3 is a diagram showing the configuration of a temperature detector according to a second embodiment of the present invention.

FIG. 3 is a diagram showing the configuration of a temperature detector according to a second embodiment of the present invention. The temperature detector of this embodiment is different from that of the first embodiment in that the anode potential holding means 16 additionally includes a first negative feedback amplifier 21, a second negative feedback amplifier 22, diodes 23 and 24, and a resistance 25. All other components are similar to those described in connection with the first embodiment.

The first negative feedback amplifier 21 receives the anode potential of the temperature sensing diode 13 on its noninverting input terminal. The second negative feedback amplifier 22, on the other hand, receives the output voltage of the first negative feedback amplifier 21 on its noninverting input terminal and outputs a temperature signal. The output of the second negative feedback amplifier 22 is fed back to its own inverting input terminal and to the inverting input terminal of the first negative feedback amplifier 21 through the resistance 25. Further, one end of the diode 23 is connected between the resistance 25 and the inverting input terminal of the first negative feedback amplifier 21, while the other end is connected to the output side of the first negative feedback amplifier 21. The diode 24 and the diode 23 are connected in parallel in reverse polarity.

Having the above configuration, the anode potential holding means 16 prevents the anode potential of the temperature sensing diode from being output when its level is lowered due to negative noise during the switching operation of the semiconductor switching device, which allows the temperature detector to avoid outputting erroneous signals, as in the case of the first embodiment. Further, the circuit connected to the anode of the temperature sensing diode 13 has high impedance and hence does not affect the anode potential very much. Further, since the anode potential holding means 19 has a two stage negative feedback configuration, the detection error of the temperature detector is very small and the temperature detection response speed can be increased. Still further, the output impedance of the anode potential holding means 16 can be adjusted, eliminating the need to increase the input impedance of the circuit side (not shown) that receives the temperature signal. This means that the circuit connected to the output of the anode potential holding means 16 can have any arbitrary configuration, which leads to wider application of the temperature detector. Since the gain of the second negative feedback amplifier is stable, the detection signal is highly stable with parameter variations, such as power voltage and temperature variations, and with time. Further, since the anode potential holding means 16 (or the temperature detector) outputs the temperature signal through an amplifier (i.e., the second negative feedback amplifier 22), its output impedance can be adjusted to a desired value.

Third Embodiment

Figure 4:
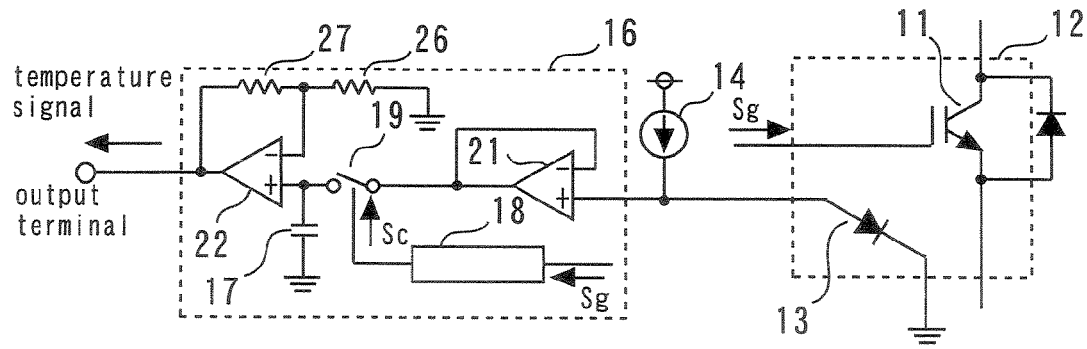
FIG. 4 is a diagram showing the configuration of a temperature detector according to a third embodiment of the present invention.

FIG. 4 is a diagram showing the configuration of a temperature detector according to a third embodiment of the present invention. The temperature detector of this embodiment is different from that of the first embodiment in that the anode potential holding means 16 additionally includes a first negative feedback amplifier 21, a second negative feedback amplifier 22, and resistances 26 and 27. All other components are similar to those described in connection with the first embodiment.

The first negative feedback amplifier 21 receives the anode potential of the temperature sensing diode 13 on its noninverting input terminal. The second negative feedback amplifier 22, on the other hand, receives the output voltage of the first negative feedback amplifier 21 on its noninverting input terminal and outputs a temperature signal. The output of the second negative feedback amplifier 22 is grounded via the resistances 26 and 27, and the connection point between the resistances 26 and 27 is connected to the inverting input terminal of the amplifier 22.

The gain of the second negative feedback amplifier 22 can be varied by varying the values of the resistances 26 and 27, which produces the same effect as the second embodiment. Furthermore, the temperature signal can be amplified to a desired voltage level, resulting in reduced temperature signal errors.

Fourth Embodiment

Figure 5:
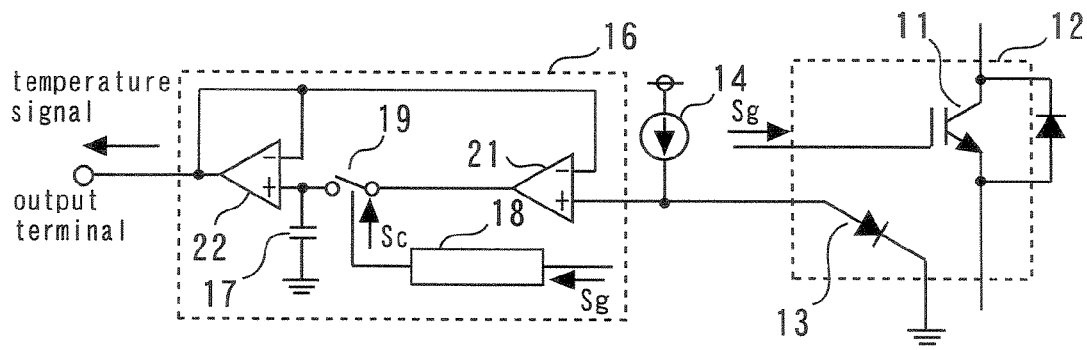
FIG. 5 is a diagram showing the configuration of a temperature detector according to a fourth embodiment of the present invention.

FIG. 5 is a diagram showing the configuration of a temperature detector according to a fourth embodiment of the present invention. The temperature detector of this embodiment is different from that of the first embodiment in that the anode potential holding means 16 additionally includes a first negative feedback amplifier 21 and a second negative feedback amplifier 22. All other components are similar to those described in connection with the first embodiment.

The first negative feedback amplifier 21 receives the anode potential of the temperature sensing diode 13 on its noninverting input terminal. The second negative feedback amplifier 22, on the other hand, receives the output voltage of the first negative feedback amplifier 21 on its noninverting input terminal and outputs a temperature signal. Further, the output signal of the second negative feedback amplifier 22 is fed back to its own inverting input terminal and to the inverting input terminal of the first negative feedback amplifier 21.

The present embodiment provides a lower cost configuration than the second embodiment, but produces the same effect as the second embodiment.

Fifth Embodiment

Figure 6:
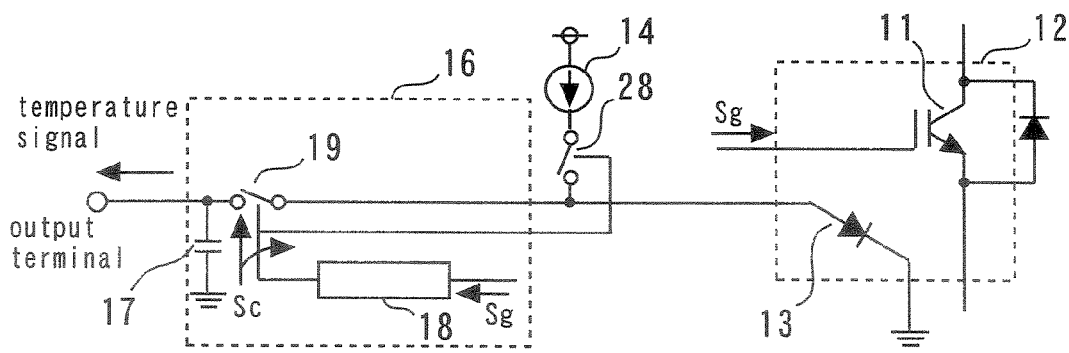
FIG. 6 is a diagram showing the configuration of a temperature detector according to a fifth embodiment of the present invention.

FIG. 6 is a diagram showing the configuration of a temperature detector according to a fifth embodiment of the present invention. The temperature detector of this embodiment is different from that of the first embodiment in that it additionally includes a second switching means 28. All other components are similar to those described in connection with the first embodiment.

Figure 7:
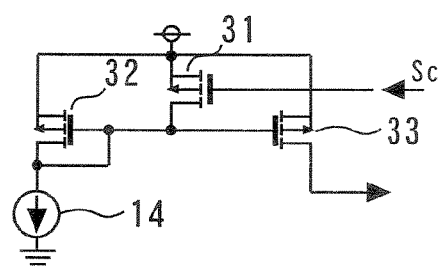
FIG. 7 is a diagram showing the configuration of second switching means.

FIG. 7 is a diagram showing the configuration of the second switching means 28. Referring to the figure, the second switching means 28 includes NMOS transistors 31 to 33. The drain of each transistor is connected to a power supply (voltage), and a control signal Sc is input from the one-shot pulse generating circuit 18 to the gate of the transistor 31. The sources of the transistors 31 and 32 and the gates of the transistors 31 and 33 are connected to the constant current circuit 14. Further, a bias current Ia is supplied from the source of the transistor 33 to the anode of the temperature sensing diode 13.

Figure 8:
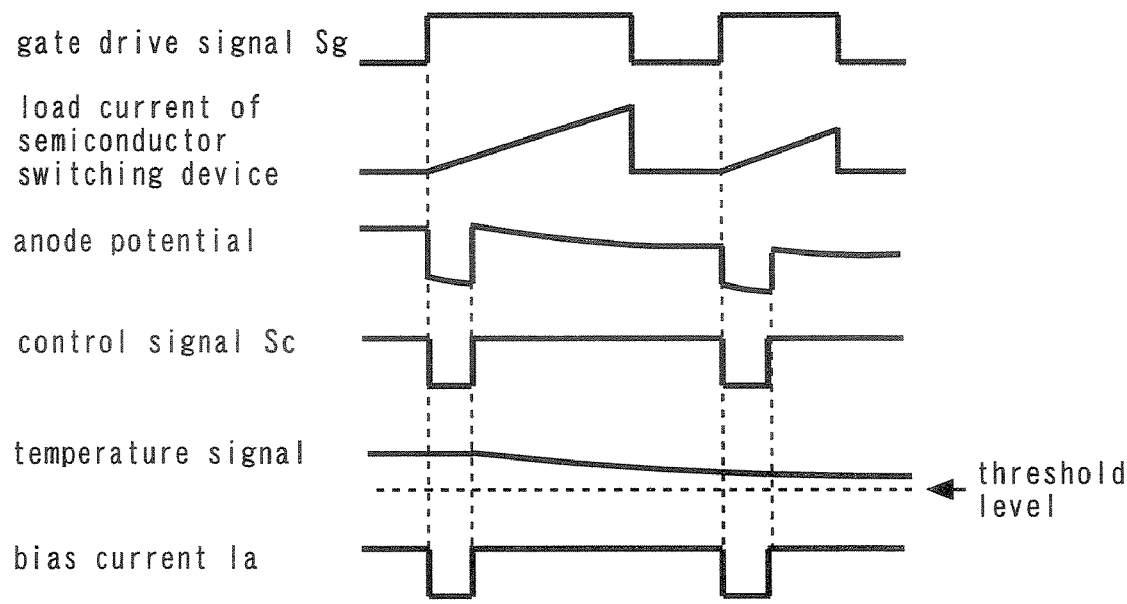
FIG. 8 is a timing chart showing the operation of the temperature detector shown in FIG. 6.

FIG. 8 is a timing chart showing the operation of the temperature detector shown in FIG. 6. As shown in the figure, the second switching means 28 stops the supply of the bias current from the constant current circuit 14 to the anode of the temperature sensing diode 13 for a predetermined period of time from the start of (each turn-on operation in) the switching operation of the semiconductor switching device 11. That is, the second switching means 28 supplies the bias current during each anode potential detection period and stops its supply during each anode potential holding period. This reduces power consumption, as well as achieving the same effect as the first embodiment. It should be noted that the present embodiment may be combined with the second to fourth embodiments.

Sixth Embodiment

Figure 9:
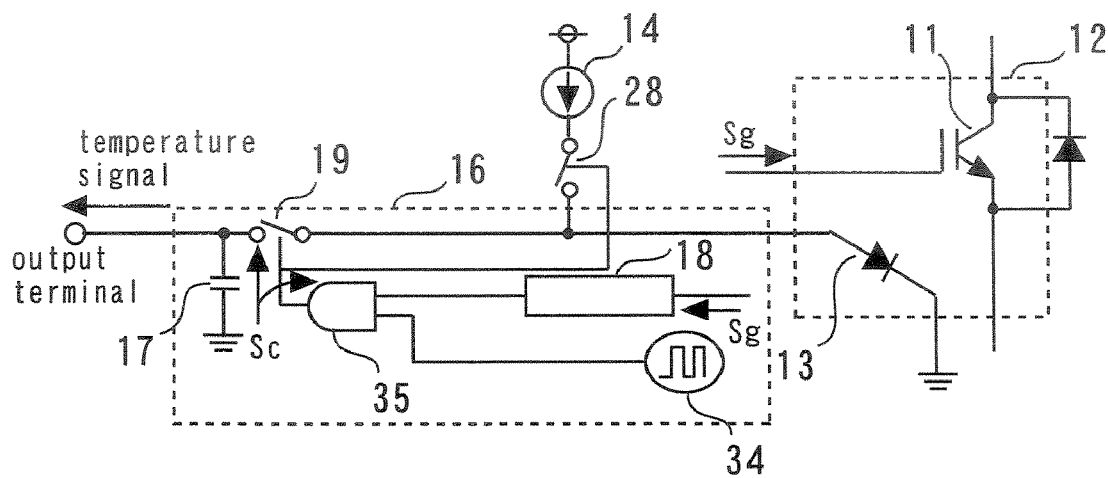
FIG. 9 is a diagram showing the configuration of a constant current circuit according to a sixth embodiment of the present invention.
Figure 10:
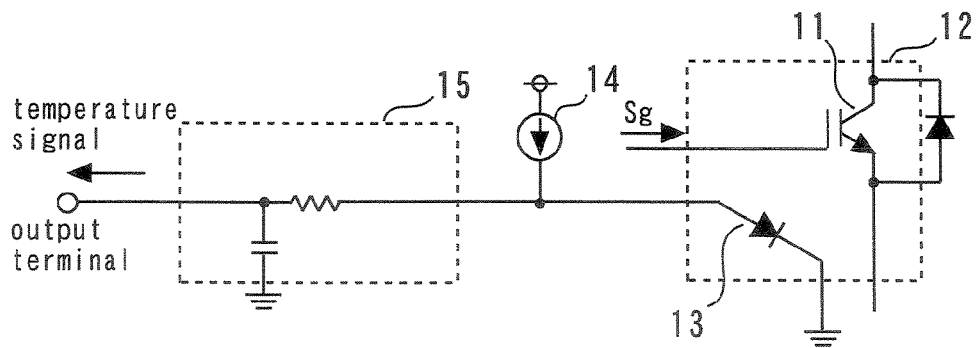
FIG. 10 is a diagram showing the configuration of a conventional temperature detector.
Figure 11:
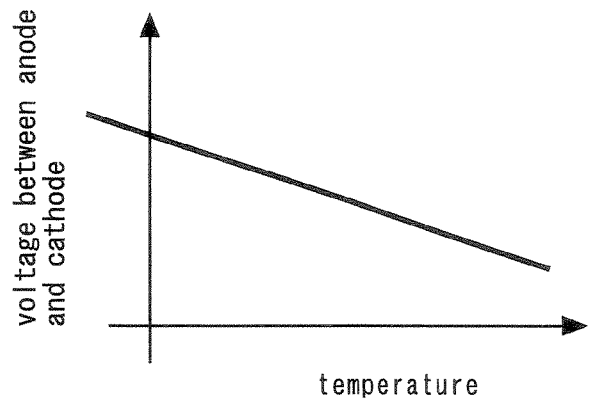
FIG. 11 is a diagram showing the temperature vs. voltage characteristics of a temperature sensing diode.
Figure 12:
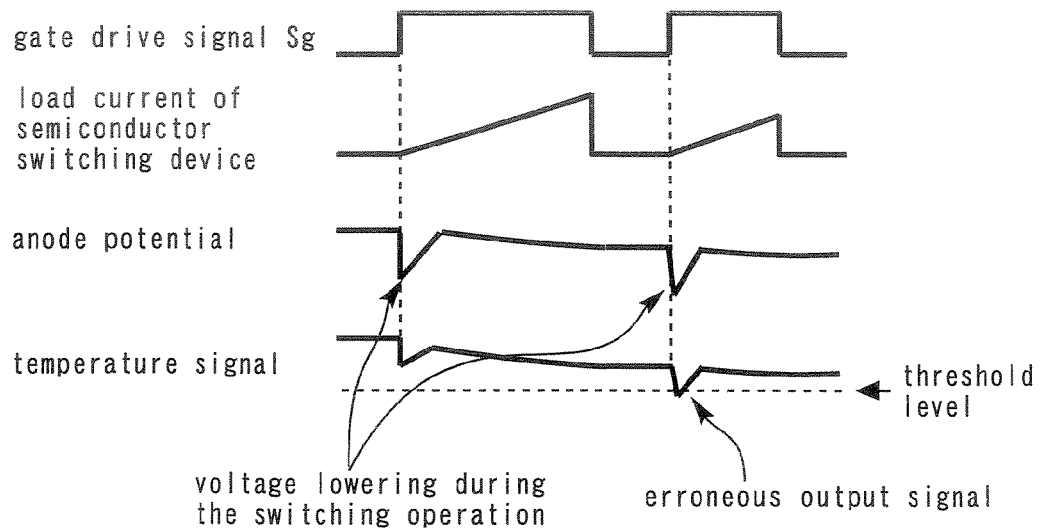
FIG. 12 is a timing chart showing the operation of the temperature detector shown in FIG. 10.

FIG. 9 is a diagram showing the configuration of a temperature detector according to a sixth embodiment of the present invention. The temperature detector of this embodiment is different from that of the fifth embodiment in that the anode potential holding means 16 additionally includes a periodic signal generator 34 and an AND circuit 35. All other components are similar to those described in connection with the fifth embodiment.

The periodic signal generator 34 generates a periodic signal starting from the start of the switching operation of the semiconductor switching device 11. The AND circuit 35 receives this periodic signal and the output signal of the one-shot pulse generating circuit 18 and performs a logical AND operation on them to output a control signal Sc to the first switching means 19 and the second switching means 28.

The first and second switching means 19, 28 operate in synchronization with the periodic signal (or the control signal Sc). Thus, the present embodiment allows the control signal to be finely divided (or allows the period of the control signal to be finely adjusted), resulting in a further reduction in the power consumption, as compared to the fifth embodiment.

According to a variation of the present embodiment, the AND circuit 35 receives a control signal from an external device, instead of the periodic signal from the periodic signal generator 34 shown in FIG. 9. Such an arrangement allows the external device (that is, the circuit or system side that receives the temperature signal) to control the operational state of the temperature detector. This means that the circuit or system side can control the temperature detector such that the detector operates only when the circuit or system side needs to receive the temperature signal, which further reduces power consumption.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-250765, filed on Sep. 15, 2006 including specification, claims, drawings and summary, on which the Convention priority of the present application is based, are incorporated herein by reference in its entirety.

What is claimed is:

1. A temperature detector for outputting a temperature signal, comprising:
    a temperature sensing diode formed on the same chip as a semiconductor switching device and having a specific temperature vs. voltage characteristic, wherein the temperature detector outputs the anode potential of the temperature sensing diode as the temperature signal;
    a constant current circuit for supplying a current to the anode of the temperature sensing diode; and
    anode potential holding means for holding the anode potential of the temperature sensing diode as the temperature signal at the start of switching operation of the semiconductor switching device.

2. The temperature detector as claimed in claim 1, wherein the anode potential holding means includes:
    a capacitor connected at one end to between the anode of the temperature sensing diode and an output terminal, the other end of the capacitor being grounded; and
    first switching means for disconnecting the anode of the temperature sensing diode from the one end of the capacitor for a predetermined period of time from the start of the switching operation of the semiconductor switching device.

3. The temperature detector as claimed in claim 2, further comprising:
    a periodic signal generator for generating a periodic signal starting from the start of the switching operation of the semiconductor switching device;
    wherein the first switching means operates in synchronization with the periodic signal.

4. The temperature detector as claimed in claim 1, wherein the anode potential holding means includes:
    a first negative feedback amplifier receiving the anode potential of the temperature sensing diode on its noninverting input terminal; and
    a second negative feedback amplifier receiving the output voltage of the first negative feedback amplifier on its noninverting input terminal and outputs the temperature signal.

5. The temperature detector as claimed in claim 4, wherein the gain of the second negative feedback amplifier can be varied.

6. The temperature detector as claimed in claim 1, further comprising:
    second switching means for stopping the current supply from the constant current circuit to the anode of the temperature sensing diode for a predetermined period of time from the start of the switching operation of the semiconductor switching device.

7. The temperature detector as claimed in claim 6, further comprising:
    a periodic signal generator for generating a periodic signal starting from the start of the switching operation of the semiconductor switching device;
    wherein the second switching means operates in synchronization with the periodic signal.

* * * * *